(12) United States Patent  
Colwell et al.

(10) Patent No.: US 9,202,000 B1  
(45) Date of Patent: Dec. 1, 2015

(54) IMPLEMENTING DESIGNS OF GUARD RING AND FILL STRUCTURES FROM SIMPLE UNIT CELLS

(71) Applicant: Cadence Design Systems, Inc., San Jose, CA (US)

(72) Inventors: Regis Colwell, Gibsonia, PA (US); Gilles Lamant, Sunnyvale, CA (US); Jeremiah Emerson Cessna, Pittsburgh, PA (US); Khaled M. Elgalaind, Allison Park, PA (US); Haitham Gad, Allison Park, PA (US); Hsun-Chieh Yu, Bade (TW); Ming Yi Fang, Hsin-Chu (TW)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/503,271

(22) Filed: Sep. 30, 2014

(51) Int. Cl.  
G06F 17/50 (2006.01)

(52) U.S. Cl.  
CPC .................................. G06F 17/5072 (2013.01)

(58) Field of Classification Search  
CPC ............ G06F 17/5045; G06F 17/5068; G06F 17/5072  
USPC ......................................... 716/118, 119, 122  
See application file for complete search history.

(56) References Cited

U.S. PATENT DOCUMENTS

| | | | | |
|---|---|---|---|---|
| 5,795,682 A * | 8/1998 | Garza | ................ | 430/5 |
| 6,078,085 A * | 6/2000 | Suzuki | ................ | 257/369 |
| 7,253,012 B2 * | 8/2007 | Kerr et al. | ................ | 438/22 |
| 7,265,328 B2 * | 9/2007 | Mouli | ................ | 250/208.1 |
| 7,350,160 B2 * | 3/2008 | Perez et al. | ................ | 716/119 |
| 7,407,824 B2 * | 8/2008 | Kerr et al. | ................ | 438/22 |
| 7,479,426 B2 * | 1/2009 | Chen et al. | ................ | 438/257 |
| 7,543,262 B2 * | 6/2009 | Wang et al. | ................ | 716/119 |
| 7,958,467 B2 * | 6/2011 | Bowen | ................ | 716/100 |
| 8,205,184 B2 * | 6/2012 | Sode | ................ | 716/127 |
| 8,954,903 B1 * | 2/2015 | Yadav et al. | ................ | 716/102 |
| 9,092,589 B2 * | 7/2015 | Chai et al. | | |

* cited by examiner

*Primary Examiner* — Sun Lin  
(74) *Attorney, Agent, or Firm* — Kenyon & Kenyon LLP (57) ABSTRACT

Systems and methods for creating and placing custom guard rings create a guard ring from a plurality of unit cells reflecting the devices that are enclosed in the guard ring. Using a unit cell identified by a design tool user as the basic unit of the guard ring, with a few additional setup parameters, a complete, content-aware guard ring is created. The guard ring will consist of a collection of the identified unit cells placed around the circuit devices that are to be protected. The created guard ring will function as a single circuit component. Edits to the dimensions and/or parameters of the unit cell will affect the placement of the unit cell in the protected area and will therefore require creation of a new guard ring consistent with the changed parameters.

19 Claims, 9 Drawing Sheets

IMPLEMENTING DESIGNS OF GUARD RING AND FILL STRUCTURES FROM SIMPLE UNIT CELLS

BACKGROUND

Aspects of the present invention relate generally to the field of integrated circuit design, and more specifically to the creation of guard rings.

Integrated circuit (IC) design is increasingly complex, sometimes involving millions of elements, shapes or geometries, and may be facilitated with an electronic design automation (EDA) tool that allows a designer to interactively position ("place") and connect ("route") various shapes on the circuit. As part of the process of physical design, the EDA tool creates a circuit layout containing the physical locations and dimensions of the circuit's components, interconnections, and various layers from the original design that may then be fabricated, creating the IC. The designed IC is eventually fabricated by transferring or printing the circuit layout to a semiconductor substrate in a series of layers that collectively will form the features that constitute the devices that make up the components of the integrated circuit.

During the process of physical design of the IC, guard rings are often added to enclose one or more devices (e.g. transistors) in the layout. The added guard rings isolate and protect the enclosed device(s), for example, against a latchup problem, or from external noise. Often, there are very strict and/or complex rules for the correct creation of guard rings, and manual or custom creation is difficult as a result. Additionally, as the geometries of a circuit design get increasingly smaller, it would be advantageous to create guard rings that are similar to or reflect the devices being enclosed, or at least are designed in consideration of those devices. However, due to the strictness and/or complexity of the rules involved in creating a guard ring, adjusting conventional approaches to reflect the associated devices would be complex, time and resource exhaustive, and error prone.

Accordingly, there is a need in the art for a system, with very simple inputs, that can construct the guard ring structure correctly.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

Using a unit cell identified by the design tool user as a basic unit of the guard ring, with a few additional setup parameters, a complete, content-aware guard ring can be created from a plurality of unit cells. The unit cell may be a simple structure, reflecting the devices to be enclosed, and can be easy to create. A collection of unit cells placed together should be able to create the ring structure required, placed around the circuit devices that are to be protected. The created guard ring will function as a single circuit component. Edits to the dimensions and/or parameters of the protected circuit devices may affect the placement of the unit cell in the protected area and may therefore require creation of a new guard ring consistent with the changed parameters.

Figure 1:
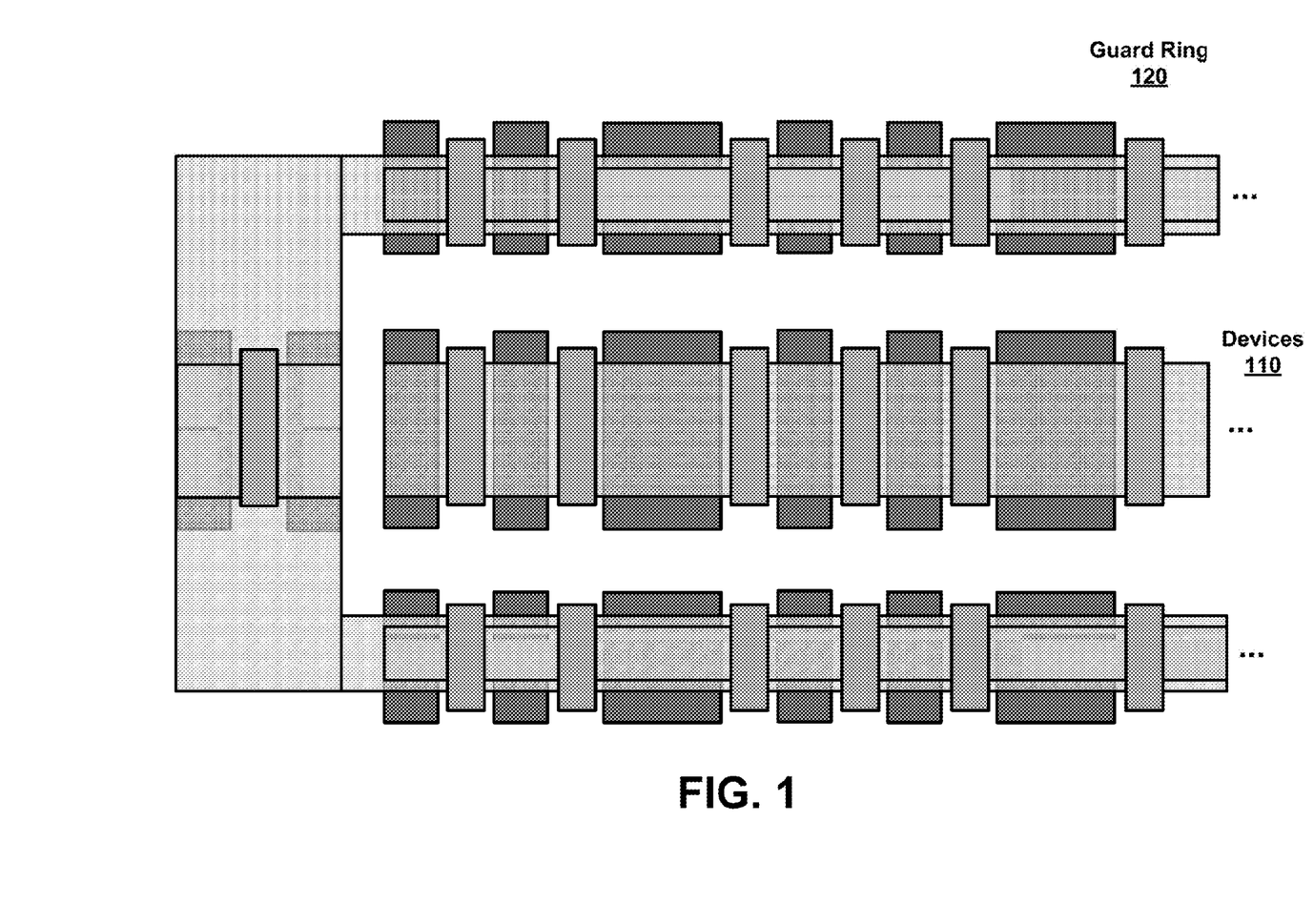
FIG. 1 illustrates an exemplary guard ring placed to protect a row of devices according to an embodiment.
Figure 2:
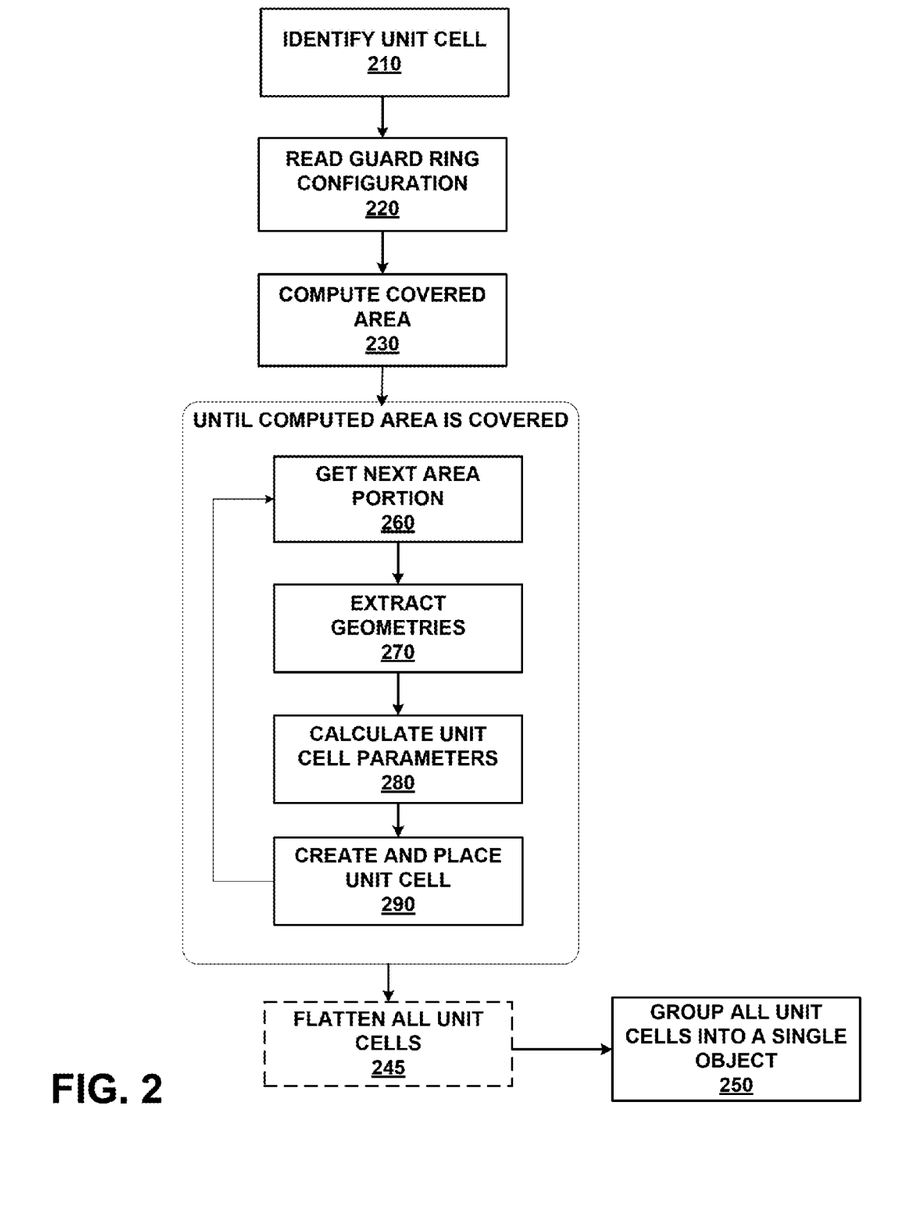
FIG. 2 is a simplified flow diagram illustrating an exemplary method for creating a guard ring according to an embodiment.
Figure 3:
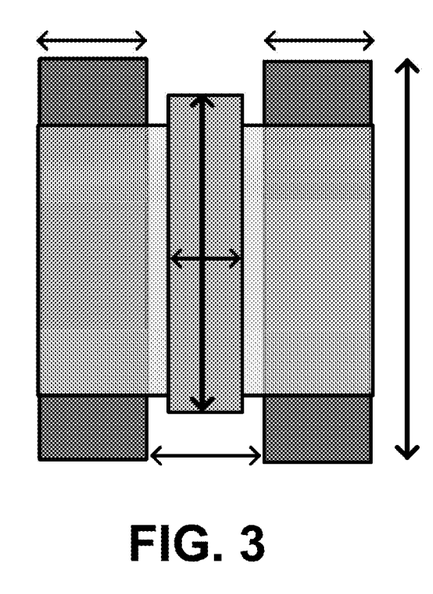
FIG. 3 illustrates an exemplary unit cell for defining a guard ring according to an embodiment.

FIG. 1 illustrates an exemplary guard ring 120 placed to protect a row of devices 110 according to an embodiment of the present invention. As shown in FIG. 1, the composition of the guard ring 120 reflects the circuit devices 110 being enclosed. FIG. 2 is a simplified flow diagram illustrating an exemplary method for creating a guard ring according to an embodiment. Preliminarily a design tool user will create a unit cell or access a predefined unit cell that will be used to form segments of the guard ring (block 210). A unit cell is a basic unit that will be used to create the guard ring according to the embodiments described herein. The unit cell may be composed of a series of shapes similar to the shapes in the circuit design that are to be protected by a guard ring. The shapes of the unit cell can be duplicated and placed to form a guard ring. The unit cell will have parameters and dimensions that the user can define or alter in order to define the guard ring. FIG. 3 illustrates an exemplary unit cell for defining a guard ring according to an embodiment. As described further below, the dimensions of an identified unit cell, illustrated with arrows in FIG. 3, may be adjusted and controlled based on the protected geometries within the guard ring.

Figure 4:
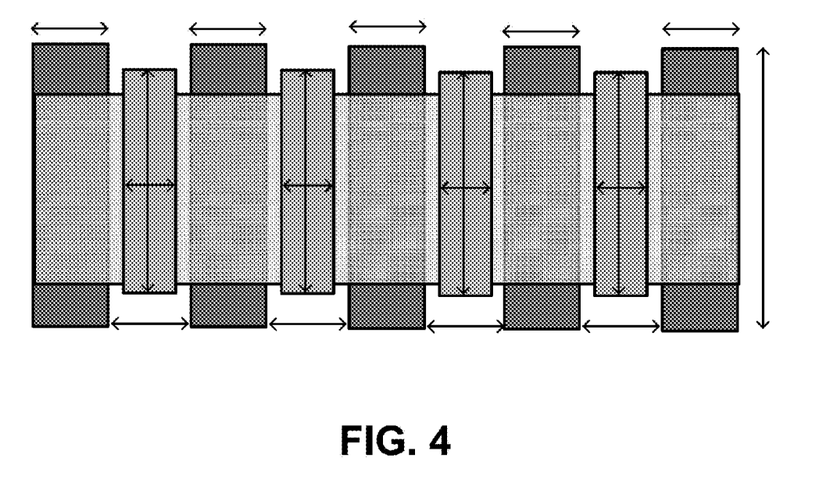
FIG. 4 illustrates another exemplary unit cell for defining a guard ring according to an embodiment.

The created guard ring will consist of a series of combined unit cells, each unit cell forming a segment of the guard ring. The unit cell should represent the items being protected by the guard ring, thereby making the guard ring geometries consistent with the protected contents. FIG. 4 illustrates another exemplary unit cell for defining a guard ring according to an embodiment. If additional parameters are needed to properly create a guard ring according to the embodiments described herein, the user may be prompted to enter or adjust the necessary parameters.

Returning to FIG. 2, based on the selected unit cell, the configuration parameters of the guard ring will be determined (block 220). Then, the area of the design that needs to be covered by the guard ring can be computed (block 230). Based on the area to be covered and the unit cell selected as the basis for the guard ring, unit cells will be placed in the computed area. Specifically, the area around the geometries that needs to be covered with a guard ring will be computed and identified. The identified area will then be covered with a plurality of unit cells. The computation may include identifying default or user defined parameters for the unit cells comprising the guard ring instance and determining how the unit cells will be applied to a region of the circuit design. According to an embodiment, a guard ring definition file will contain a description of the guard ring, including parameters used to delineate the area that will be covered or encompassed by the guard ring Additionally, system design rules may inform the guard ring definition and placement.

Figure 5:
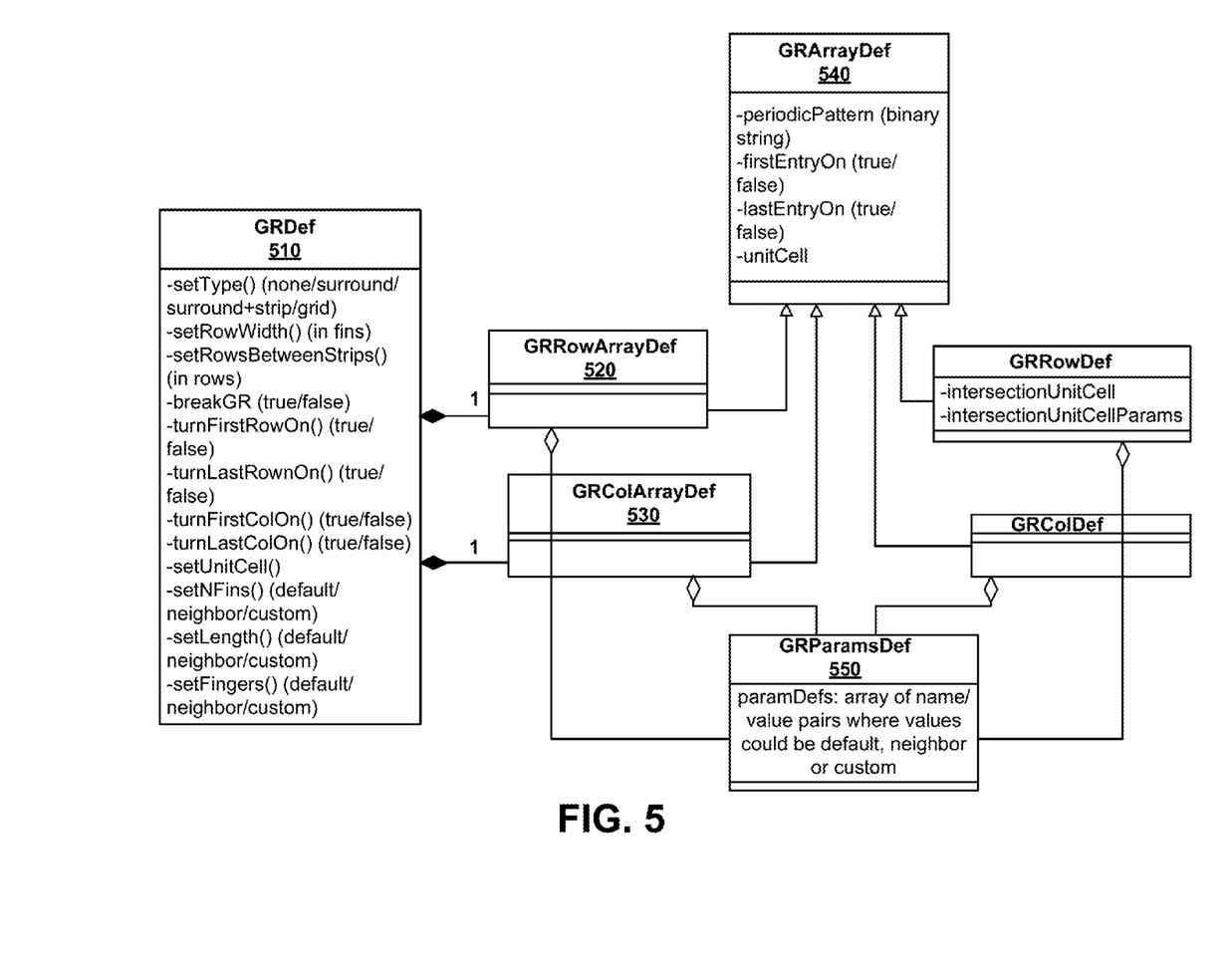
FIG. 5 is a simplified block diagram that illustrates an exemplary guard ring definition according to an embodiment.

FIG. 5 is a simplified block diagram that illustrates an exemplary guard ring definition according to an embodiment. The guard ring definition 510 describes an area of a circuit design that needs to be covered with a guard ring. For example, the guard ring may be defined to surround all four sides of the protected items, to include additional guard ring objects between rows of protected items, etc.

As shown in FIG. 5, an exemplary Unified Modeling Language (UML) guard ring definition 510 may have several parameters and functions for setting the parameters. The user can set, edit, or update the definition, and the parameters and functions, to create a custom guard ring. For example, exemplary parameters may include a guard ring type, which describes the type of guard ring and may be limited to none, surrounds, and surrounds plus strip or grid, etc. Other descriptive items also may be set, including the row width; the length, and the inclusion or exclusion of fingers between neighboring design elements. Other such items may include the number of rows between strips. In addition, it is possible to set the unit cell (such as, for example, the exemplary unit cell in FIG. 3) using the setUnitCell( ) function in the guard ring definition 510. The guard ring definition 510 may be supported by one or more related object definitions, including a definition for a row array 520 and a definition for a column array 530, each of which may be a subclass of a general guard ring array definition 540. As shown in FIG. 5, the guard ring array definition may also rely on row and columns definitions, subclasses that will make up the elements of the array. These subclasses may be used to describe regions (e.g. arrays) of the design. Other objects included as part of the guard ring may also be defined, for example a parameters definition 550 that describes the name value pairs of the parameters as an array and may limit the parameter values to a default value, the same value as set in a neighboring object, or a custom value defined by the user. Objects associated with the guard ring definition may be created to assist in the creation and definition of a guard ring that will be implemented according to the techniques described herein.

Once the guard ring parameters are set for an instance of the guard ring definition 510, the parameters effectively define the shape and placement of the guard ring and will be used to compute and identify the area of the design that will be covered with a unit cell. Using the unit cell defined in the instance of this guard ring definition 510, multiple instances of the unit cell will be placed to create a guard ring according to the parameters set in the in the guard ring definition 510.

UML, referred to above, is an exemplary and non-limiting language only. Any suitable programming language may be used for the definition of the guard ring and other objects.

Returning to FIG. 2, until the calculated area delineated by the guard ring definition is covered with unit cells, a next part of the computed area that will be covered by a unit cell is computed (260). Each computed part is a segment of the guard ring area that can be covered by a single unit cell. Then, all the geometries that will be protected by the guard ring in the newly-computed part are extracted (block 270) and the parameters and dimensions for a unit cell based on those geometries are calculated (block 280). For example, the unit cell in FIG. 3 may cover an area between two fingers of a transistor. A definition for a guard ring using the illustrated unit cell can include such area coverage details as well as instructions detailing how to compute the boundaries. According to an embodiment, the guard ring boundaries may be indicated by specific layers present in the design. The boundary information will then be used to compute the relevant unit cell parameters.

Based on the calculated parameters and dimensions, a unit cell similar to the unit cell identified previously (block 210) then is created, and is placed to form a segment of the guard ring instance in the newly computed part of the guard ring area (block 290). Once all of the guard ring area has been covered with unit cells, all of the placed unit cells are grouped into a single object (block 250). Grouping the unit cells into a single guard ring object allows the guard ring to be treated as a single object in future processing. Design related processing, including editing and testing, will then operate on the guard ring as a single design element.

Optionally, after all of the unit cells forming the guard ring segments are created and placed, any extra geometries specified by the definition of the guard ring may be added as necessary, including any geometries that span multiple segments (not shown).

According to an aspect of an embodiment, if a guard ring definition parameter is changed, for example, utilizing one of the functions provided by the guard ring definition described with reference to FIG. 5, the change in parameter may affect the layout of the unit cell instances forming the guard ring. If there is an effect on the layout, it may be necessary to create a new guard ring. For example, if a unit cell height is altered, a new guard ring will be created consistent with the method described in FIG. 2. This will allow the user to 'edit' the guard ring instance while maintaining the restrictions required by the guard ring definition.

Optionally, as shown in the dashed lines of FIG. 2, once there are no additional areas that need to be covered by the guard ring instance (block 240), the unit cells may be flattened (block 245). The geometries may be flattened in order to eliminate duplicate geometries and remove the individual instances of the unit cells. The flattened unit cells will then be grouped as a single guard ring (block 250).

Figure 6:
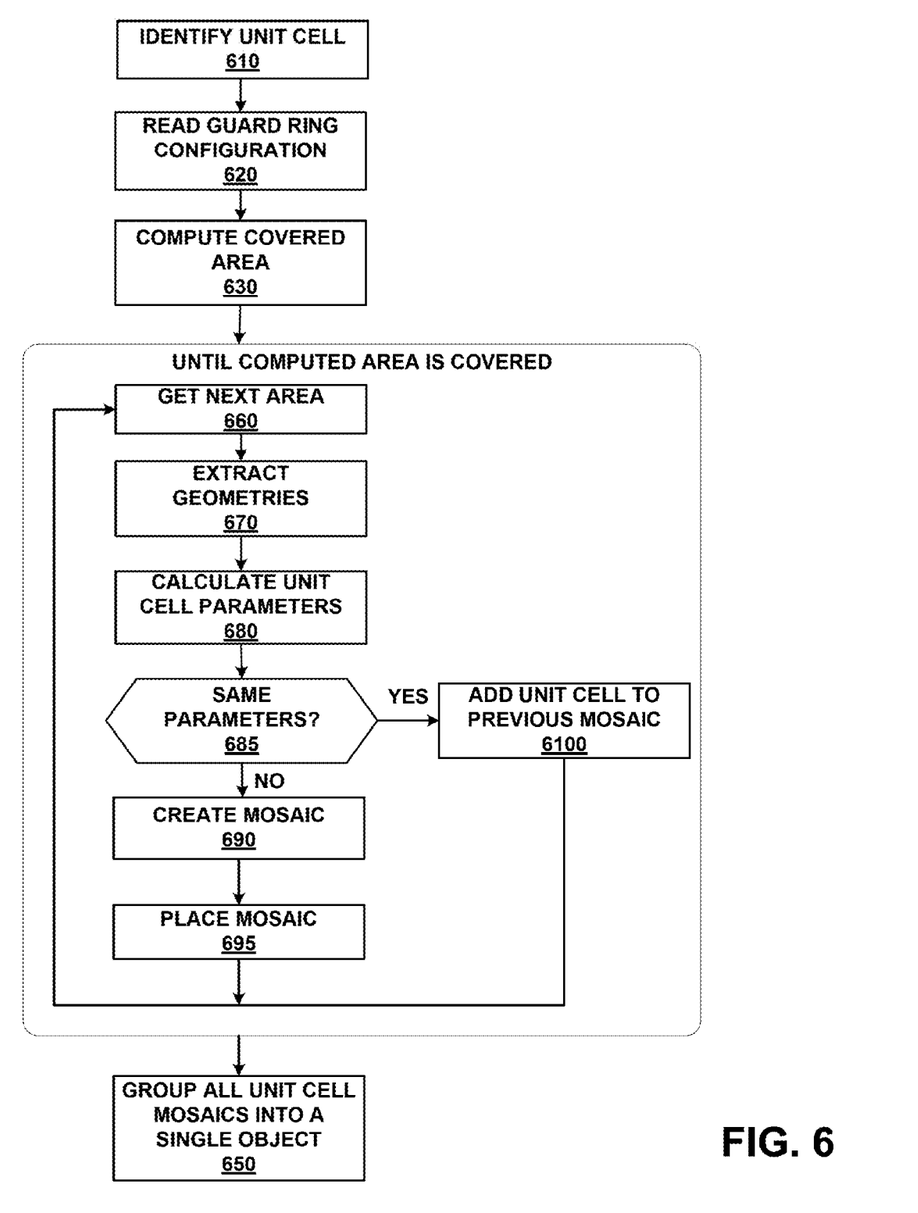
FIG. 6 is a simplified flow diagram illustrating an exemplary method of creating a guard ring with a compressed geometry using array instances (aka mosaic) according to an embodiment.

FIG. 6 is a simplified flow diagram illustrating an exemplary method of creating a guard ring with a compressed geometry using array instances according to an embodiment. Using OpenAccess or similar database array instances to store the configuration and placement information for like unit cells placed in the guard ring area provides for more efficient storage of the guard ring implementations. The composites stored in an OpenAccess array instance, also known as a mosaic, may be created to span multiple guard ring segments that would otherwise require multiple unit cells. A mosaic may cover multiple guard ring segments, where those segments would otherwise contain a plurality of unit cells having the same parameters and dimensions, thereby maintaining a single record of the configuration. Similarly to the method described in FIG. 2, preliminarily a system user will create a unit cell or access a predefined unit cell for the guard ring (block 610). Then, based on the selected unit cell, the configuration parameters of the guard ring will be determined (block 620). The system can then compute the area of the design that needs to be covered by the guard ring (block 630). Until the entire computed area is covered, a next part of the area that will be covered with a unit cell is computed (block 660). Then all the geometries in the computed area part are extracted (block 670) and the unit cell parameters for those geometries are calculated (block 680).

If the parameters calculated for a new unit cell are the same as those for a previous unit cell (block 685), then the new unit cell is added to the mosaic created for the previous unit cell to create the guard ring instance (block 6100). If the parameters calculated for the current unit cell are not the same as those for the previous unit cell (block 685), a new unit cell mosaic having the calculated parameters and dimensions is created for the new unit cell (block 690) and the mosaic is placed to create a segment of the guard ring instance (block 695). A different mosaic will be created for each configuration of parameters and dimensions that would be used by unit cells forming the guard ring segments.

Once the computed area is covered with mosaics, the mosaics are grouped into a single guard ring object (block 650).

Figure 7:
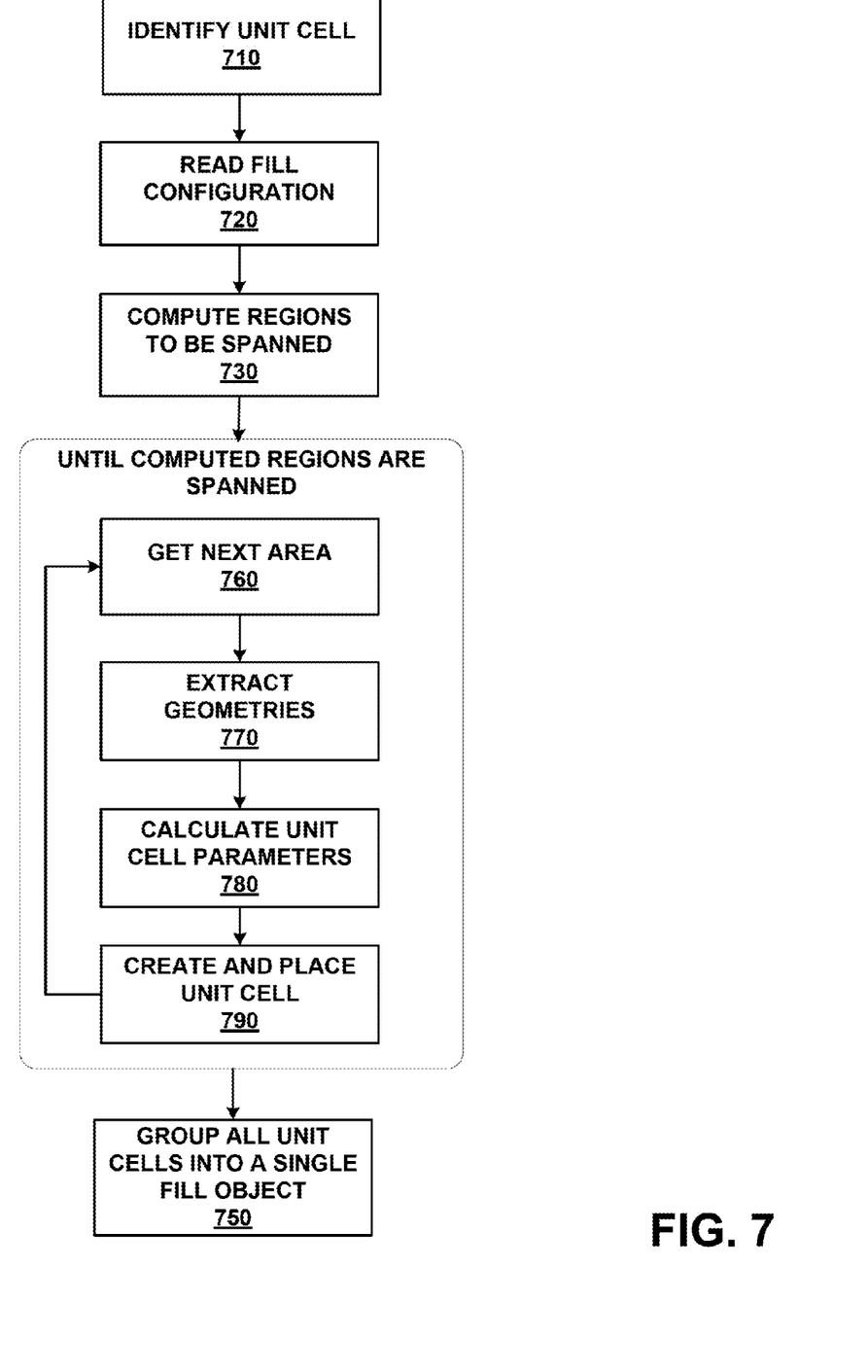
FIG. 7 is a simplified flow diagram illustrating an exemplary method of creating a fill according to an embodiment.

A similar method may be used to create a fill of an area of the design rather than a guard ring. FIG. 7 is a simplified flow diagram illustrating an exemplary method of creating a fill according to an embodiment. As with the guard ring implementations, the fill geometry will be closely related to the actual geometries near the covered region, although fill configurations will not necessarily be placed in a ring shape. Similarly to the method described in FIG. 2, a system user will select a unit cell (block 710), and will determine a region of the design and the configuration parameters for the fill (block 720). Then, the area of the design that needs to be covered by the fill can be computed (block 730). Until the fill area has been covered, a next part of the area that will be covered with a unit cell is computed (block 760). Then all the geometries in the computed region are extracted (block 770) and the unit cell parameters for those geometries are calculated (block 780). Then a unit cell is created with the calculated parameters, and placed to create a segment of the fill instance (block 790). When the entire calculated fill area has been covered or spanned, the placed unit cells are grouped into a single fill object (block 750).

Figure 8:
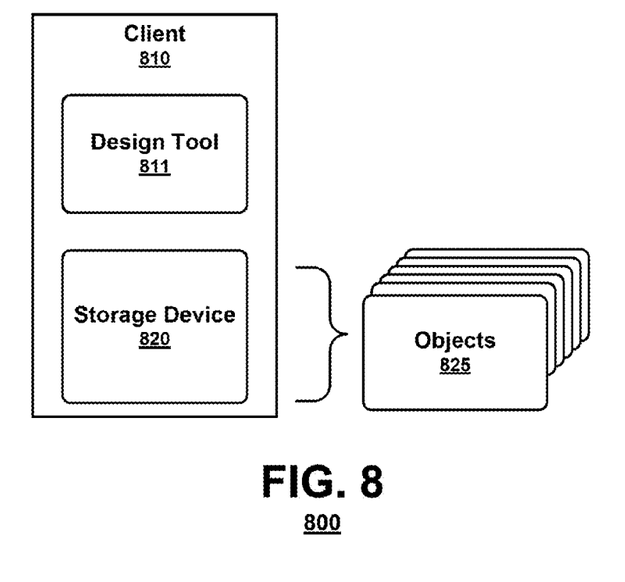
FIG. 8 is a simple block diagram illustrating components of an exemplary system according to an embodiment.

A user may access a design tool for creating a guard ring as described herein in a standalone client system, client-server environment, or a networked environment. FIG. 8 is a simple block diagram illustrating components of an exemplary system 800 according to an embodiment. As shown in FIG. 8, a system 800 may comprise a client 810 executing a design tool 811 and having a memory storage 820. The client 810 may be any computing system that executes a design tool 811 or otherwise facilitates access to memory storage 820, for example a personal computer. The client 810 may include a processor that performs a method in accordance with the disclosed embodiments. Such a client would be part of an overall design system in accordance with the disclosed embodiments.

Circuit designs and layouts, instruction sets, software packages, instances of design components, state information for the design components, and other objects 825 used by the design tool 811 may be stored in memory storage 820. A user may access the objects 825 stored in memory storage 820 with the client 810 via the design tool 811, where the design tool 811 is capable of accessing memory storage 820 and displaying the objects 825 and the data associated with the design. The design tool 811 may include a user interface, for example a program, application or middleware that acts as a frontend to and facilitates access to objects in memory storage 820. The design tool 811 may facilitate control over the design using the display and edit tools and procedures described herein. The user may interact with the design tool 811 through a number of input devices, such as by inputting a selection as with a mouse or inputting a request as with a keyboard. The user may observe the design results on an output device or display. The design tool 811 may run in an application window controlled by the user.

As shown in FIG. 8, a client 810 may be a stand-alone system, as may be of particular interest where the components being designed are highly confidential. Additionally, according to an aspect of an embodiment as shown in FIG. 9, a client 910 may be part of a networked environment.

Figure 9:
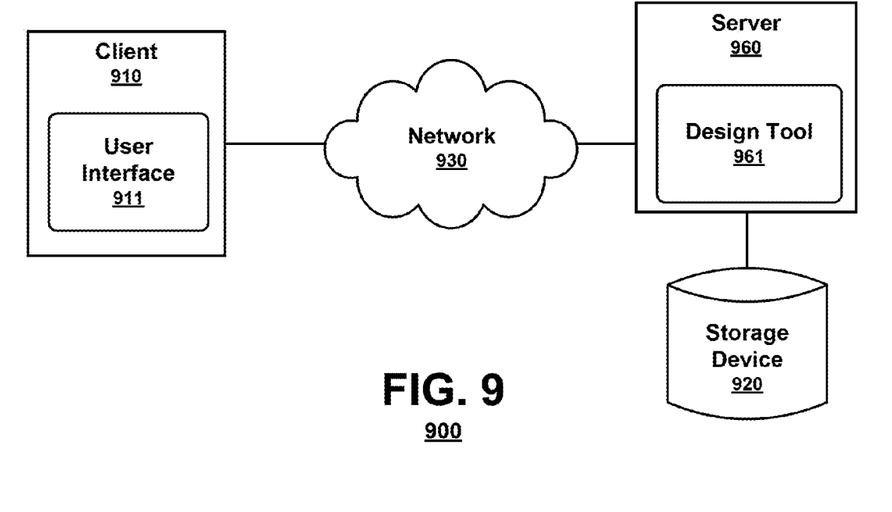
FIG. 9 is a simple block diagram illustrating components of an exemplary system according to an embodiment.

FIG. 9 is a simple block diagram illustrating components of an exemplary system 900 according to an embodiment. As shown in FIG. 9, system 900 may include a client 910 having a user interface 911. The client 910 may be connected to a server 960 via a network 930. The design tool 961, which in this embodiment is located at server 960, may have access to storage device 920 storing circuit designs and layouts, instruction sets, software packages, instances of design components, state information for the design components, and other objects utilized by the design tool 961. The server 960 may include a processor that performs a method in accordance with the disclosed embodiments. Such a server then would be part of an overall design system in accordance with the disclosed embodiments.

A user may access a design tool 961 at the server 960 via the client 910 having a user interface 911 capable of accessing and displaying the components implemented as part of a circuit design. The client 910 may be any computing system that facilitates the user accessing storage device 920, for example a personal computer. The network 930 may be a wired or wireless network that may include a local area network (LAN), a wireless area network, the Internet, or any other network available for accessing storage device 920 from the client 910.

The server 960 may be a network server accessible to the client 910 via the network 950 that may manage access to storage device 920. The user interface 911 may receive instructions regarding a design from the user and utilizing the objects stored in memory storage 920, facilitate edit and display of the design. Multiple different clients (not shown) may access storage device 920 via the network 930 and request access to the objects stored therein.

In another networked environment, the design tool may be executed on a network capable client and access the designs, packages and other objects stored in one or more storage devices via a network and communications server.

Figure 10:
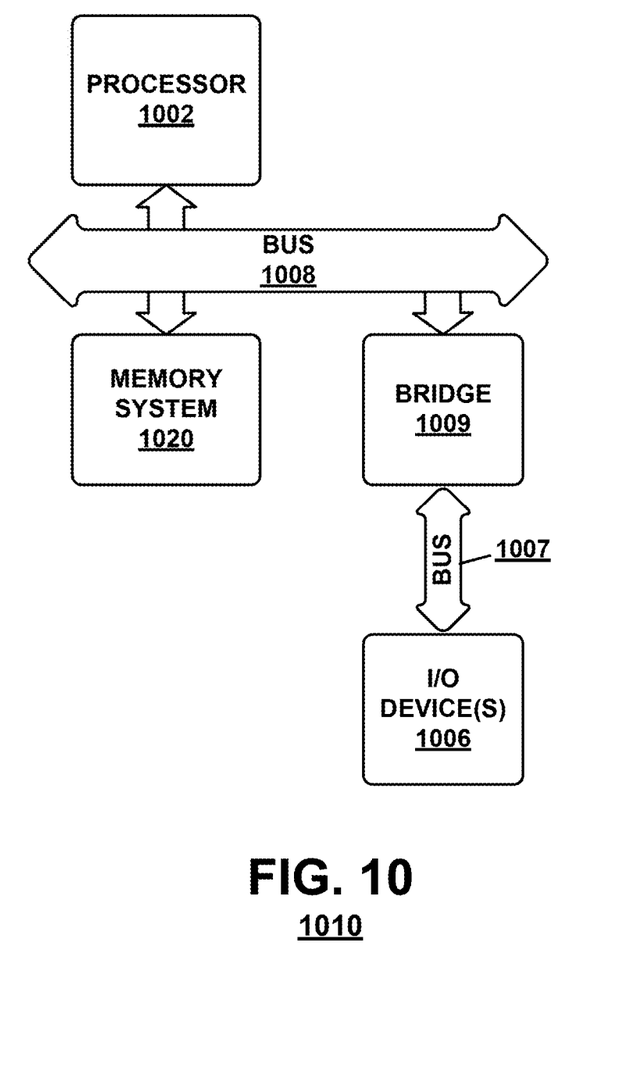
FIG. 10 is a simple block diagram illustrating components of an exemplary client according to an embodiment.

FIG. 10 is a simple block diagram illustrating components of an exemplary client 1010 according to an embodiment. As shown in FIG. 10, the client 1010 configured to execute the design tool as described herein may include a processor 1002, a memory system 1020 and one or more input/output (I/O) devices 1006 in communication. The communication can be implemented in a variety of ways and may include one or more computer buses 1007, 1008 and/or bridge devices 1009 as shown in FIG. 10. The I/O devices 1006 can include network adapters and/or mass storage devices from which the client 1010 can receive commands for executing the simulation.

As shown in FIG. 8, a client 1010 may be a stand-alone system, as may be of particular interest where the components being designed are highly confidential. Additionally, according to an aspect of an embodiment as shown in FIG. 9, a client 1010 may be part of a networked environment.

In some applications, the modules described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the embodiments. Other applications of the present invention may be embodied as a hybrid system of dedicated hardware and software components. Moreover, not all of the modules described herein need be provided or need be provided as separate units. Additionally, the arrangement of the blocks in FIGS. 2, 6, and 7 do not necessarily imply a particular order or sequence of events, nor are they intended to exclude other possibilities. For example, the operations depicted at blocks 220 (620, 720) and 230 (630, 730) may occur in any order or substantially simultaneously with each other. Such implementation details are immaterial to the operation of the present invention unless otherwise noted above.

The exemplary methods and computer program instructions may be embodied on a non-transitory computer readable storage medium that may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions. The features of the embodiments of the present invention may be implemented in hardware, software, firmware, or a combination thereof and utilized in systems, subsystems, components or subcomponents thereof.

While the invention has been described in detail above with reference to some embodiments, variations within the scope and spirit of the invention will be apparent to those of ordinary skill in the art. Thus, the invention should be considered as limited only by the scope of the appended claims.

We claim:

1. A method for using a processor for creation of a guard ring in a circuit design, the method comprising:
   upon receipt of a unit cell based on a portion of the circuit design, identifying configuration parameters for the guard ring, comprising a plurality of the unit cells, to be placed around the portion of the circuit design;
   identifying an area around the portion where the guard ring will be placed; and
   iteratively performing the following steps until the identified area has been covered:
      identifying a part of the area to be covered by a unit cell,
      extracting geometries from the identified part of the area,
      calculating unit cell parameters for a unit cell to be placed in the identified part of the area based in part on the extracted geometries,
      creating a unit cell with the calculated unit cell parameters, and
      placing the created unit cell in the identified part of the area.

2. The method of claim 1, further comprising grouping the placed unit cells into a single guard ring object.

3. The method of claim 1, further comprising: after the identified area has been covered, flattening the unit cells.

4. The method of claim 1, further comprising:
   if the calculated unit cell parameters are same for a current unit cell and a previous unit cell, adding the current unit cell to a previously created mosaic corresponding to the previous unit cell and, placing and covering the part of the area corresponding to the current unit cell with the previously created mosaic; and
   if the calculated unit cell parameters are not the same for the current unit cell and the previous unit cell, creating a new mosaic for the current unit cell and, placing and covering the part of the area corresponding to the current unit cell with the new mosaic.

5. The method of claim 4, further comprising grouping the placed mosaics into a single guard ring object.

6. The method of claim 1, further comprising:
   upon receiving an instruction to edit a dimension of the created guard ring, updating a unit cell definition to implement the edit; and
   creating a new guard ring with the updated unit cell definition.

7. The method of claim 1, further comprising: after the identified area has been covered by unit cells, placing an additional geometry as identified in the guard ring configuration parameters.

8. The method of claim 1, wherein the unit cells are placed to span the area and when the unit cells are grouped after placement, the unit cells form a fill object.

9. The method of claim 1, wherein a created unit cell is comprised of a plurality of geometries extracted from the part of the area.

10. A non-transitory computer readable medium storing instructions that when executed by a processor, cause the processor to perform a method comprising:
    upon receipt of a unit cell based on a portion of a circuit design, identifying configuration parameters for a guard ring to be placed around the portion of the circuit design;
    identifying an area around the portion where the guard ring will be placed; and
    iteratively performing the following steps until the identified area has been covered:
       identifying a part of the area to be covered by a unit cell,
       extracting geometries from the identified part of the area,
       calculating unit cell parameters for a unit cell to be placed in the identified part of the area based in part on the extracted geometries,
       creating a unit cell with the calculated unit cell parameters, and
       placing the created unit cell in the identified part of the area.

11. The non-transitory computer readable medium of claim 10, wherein the method further comprises: after the identified area has been covered, flattening the unit cells.

12. The non-transitory computer readable medium of claim 10, wherein the method further comprises:
    if the calculated unit cell parameters are same for a current unit cell and a previous unit cell, adding the current unit cell to a previously created mosaic corresponding to the previous unit cell and, placing and covering the part of the area corresponding to the current unit cell with the previously created mosaic; and
    if the calculated unit cell parameters are not the same for the current unit cell and the previous unit cell, creating a new mosaic for the current unit cell and, placing and covering the part of the area corresponding to the current unit cell with the new mosaic.

13. The non-transitory computer readable medium of claim 10, further comprising:
    upon receiving an instruction to edit a dimension of the created guard ring, updating a unit cell definition to implement the edit; and
    creating a new guard ring with the updated unit cell definition.

14. The non-transitory computer readable medium of claim 10, wherein a created unit cell is comprised of a plurality of geometries extracted from the part of the area.

15. A system comprising:
    a memory to store a circuit design;
    a processor configured to:

identify configuration parameters for a guard ring to be placed around a portion of the circuit design upon receipt of a unit cell based on the portion of the circuit design;

identify an area around the portion where the guard ring will be placed; and iteratively performing the following actions until the identified area has been covered:

identify a part of the area to be covered by a unit cell, extract geometries from the identified part of the area, calculate unit cell parameters for a unit cell to be placed in the identified part of the area based in part on the extracted geometries, create a unit cell with the calculated unit cell parameters, and place the created unit cell in the identified part of the area.

16. The system of claim 15, wherein after the identified area has been covered, the processor is further configured to flatten the unit cells.

17. The system of claim 15, wherein the processor is further configured to add a current unit cell to a previously created mosaic corresponding to a previous unit cell if the calculated unit cell parameters are same for the current unit cell and the previous unit cell to place and to cover the part of the area corresponding to the current unit cell with the previously created mosaic; and to create a new mosaic for the current unit cell to place and to cover the part of the area corresponding to the current unit cell with the new mosaic if the calculated unit cell parameters are not the same for the current unit cell and the previous unit cell.

18. The system of claim 15, wherein the processor is further configured to, upon receiving an instruction to edit a dimension of the created guard ring, update a unit cell definition to implement the edit; and create a new guard ring with the updated unit cell definition.

19. The system of claim 15, wherein a created unit cell is comprised of a plurality of geometries extracted from the part of the area.

* * * * *